(12) United States Patent
Haukka et al.

(10) Patent No.: US 9,112,003 B2
(45) Date of Patent: *Aug. 18, 2015

(54) SELECTIVE FORMATION OF METALLIC FILMS ON METALLIC SURFACES

(71) Applicant: ASM International. N.V., Almere (NL)

(72) Inventors: Suvi P. Haukka, Helsinki (FI); Antti Niskanen, Helsinki (FI); Marko Tuominen, Helsinki (FI)

(73) Assignee: ASM International N.V. (NL)

( * ) Notice: Subject to any disclaimer, the term of this patent is extended or adjusted under 35 U.S.C. 154(b) by 236 days.

This patent is subject to a terminal disclaimer.

(21) Appl. No.: 13/708,863

(22) Filed: Dec. 7, 2012

(65) Prior Publication Data

US 2013/0196502 A1     Aug. 1, 2013

Related U.S. Application Data

(60) Provisional application No. 61/569,142, filed on Dec. 9, 2011.

(51) Int. Cl.
| | | |
|---|---|---|
| *H01L 21/768* | (2006.01) | |
| *H01L 21/31* | (2006.01) | |
| *H01L 21/314* | (2006.01) | |
| *H01L 21/02* | (2006.01) | |
| *H01L 21/3105* | (2006.01) | |
| *H01L 21/285* | (2006.01) | |

(Continued)

(52) U.S. Cl.
CPC .......... *H01L 21/76864* (2013.01); *C23C 16/04* (2013.01); *C23C 16/14* (2013.01); *H01L 21/02068* (2013.01); *H01L 21/28562* (2013.01); *H01L 21/3105* (2013.01); *H01L 21/76826* (2013.01); *H01L 21/76849* (2013.01); *H01L 21/76883* (2013.01)

(58) Field of Classification Search
USPC .......................................... 438/653, 778, 643
See application file for complete search history.

(56) References Cited

U.S. PATENT DOCUMENTS

| | | | |
|---|---|---|---|
| 5,447,887 | A | 9/1995 | Filipiak et al. |
| 6,759,325 | B2 | 7/2004 | Raaijmakers et al. |
| 6,844,258 | B1 * | 1/2005 | Fair et al. ....................... 438/648 |

(Continued)

FOREIGN PATENT DOCUMENTS

WO    WO 2015/047345         4/2015

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

(Continued)

*Primary Examiner* — Vongsavanh Sengdara
*Assistant Examiner* — Thai T Vuong
(74) *Attorney, Agent, or Firm* — Knobbe, Martens, Olson & Bear, LLP

(57) ABSTRACT

Metallic layers can be selectively deposited on one surface of a substrate relative to a second surface of the substrate. In some embodiments, the metallic layers are selectively deposited on copper instead of insulating or dielectric materials. In some embodiments, a first precursor forms a layer on the first surface and is subsequently reacted or converted to form a metallic layer. The deposition temperature may be selected such that a selectivity of above about 50% or even about 90% is achieved.

30 Claims, 9 Drawing Sheets

(51) Int. Cl.
C23C 16/04 (2006.01)
C23C 16/14 (2006.01)

(56) References Cited

U.S. PATENT DOCUMENTS

| | | | |
|---|---|---|---|
| 6,878,628 | B2 | 4/2005 | Sophie et al. |
| 6,958,174 | B1 | 10/2005 | Klaus et al. |
| 7,084,060 | B1 | 8/2006 | Furukawa et al. |
| 7,323,411 | B1 | 1/2008 | Blosse |
| 7,964,505 | B2 | 6/2011 | Khandelwal et al. |
| 2003/0143839 | A1* | 7/2003 | Raaijmakers et al. ........ 438/633 |
| 2003/0181035 | A1 | 9/2003 | Yoon et al. |
| 2008/0241575 | A1 | 10/2008 | Lavoie et al. |
| 2009/0269507 | A1 | 10/2009 | Yu et al. |
| 2015/0097292 | A1 | 4/2015 | He et al. |

OTHER PUBLICATIONS

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

Grubbs et al., "Nucleation and growth during the atomic layer deposition of W on Al2O3 and Al2O3 on W", Thin Solid Films, vol. 467, 2004, pp. 16-27.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

Lei et al., "Real-time observation and opitimization of tungsten atomic layer deposition process cycle", J. Vac. Sci. Technol. B, vol. 24, No. 2, Mar./Apr. 2006, pp. 780-789.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Maluf et al., "Selective tungsten filling of sub-0.25μm trenches for the fabrication of scaled contacts and x-ray masks", J. Vac. Sci. Technol. B, vol. 8, No. 3, May/Jun. 1990, pp. 568-569.

Roberts et al., "Selective Mn deposition on Cu lines", poster presentation, 12th International Conference on Atomic Layer Deposition, Jun. 19, 2012, Dresden, Germany.

"Tungsten and Tungsten Silicide Chemical Vapor Deposition", TimeDomain CVD, Inc., retrieved from link: http://www.timedomaincvd.com/CVD_Fundamentals/films/W_WSi.html , Last modified Jul. 11, 2008.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Office Action dated Aug. 29, 2014 in U.S. Appl. No. 13/702,992.

* cited by examiner

SELECTIVE FORMATION OF METALLIC FILMS ON METALLIC SURFACES

CROSS-REFERENCE TO RELATED APPLICATIONS

This application claims priority to U.S. Provisional application No. 61/569,142, filed Dec. 9, 2011, the disclosure of which is incorporated herein by reference in its entirety.

BACKGROUND OF THE INVENTION

1. Field of the Invention

The present application relates generally to the field of semiconductor fabrication.

2. Description of the Related Art

Integrated circuits are currently manufactured by an elaborate process in which various layers of materials are sequentially constructed in a predetermined arrangement on a semiconductor substrate.

Meeting the ever increasing electromigration (EM) requirement in copper interconnects is becoming more difficult as Moore's law progresses, resulting in smaller devices. As line dimensions shrink, critical void size for EM failure is also reduced, causing a sharp decrease in mean time to failure. A significant improvement in EM resistance is required to enable continued scaling.

The interface between the dielectric diffusion barrier and copper has been shown to be the main path for copper diffusion and the weakest link in resisting EM failure. The implementation of a selective metal cap has been challenging because of the difficulty in achieving good selectivity on copper versus the dielectric surface. Methods are disclosed herein for selective deposition on metal surfaces that can be used in this context to decrease electromigration.

SUMMARY OF THE INVENTION

In one aspect, methods are provided for selectively depositing a film on a substrate comprising a first metal surface and a second dielectric surface. The methods may comprise cleaning the substrate, for example to remove a passivation layer from the metal surface, followed by a plurality of deposition cycles, each comprising contacting the substrate with a first precursor comprising silicon or boron to selectively form a layer of first material comprising Si or B on the first metal surface relative to the second dielectric surface. The first material may be converted to a second metallic material by exposing the substrate to a second precursor comprising metal. In some embodiments, selectivity for deposition on the first surface relative to the second surface may be greater than about 50%, or even greater than about 90%. The deposition temperature may be, for example, less than about 150° C.

In some embodiments, at least the metal surface on the substrate is cleaned by exposure to a plasma. The plasma may, for example, comprise one or more of Ar, H, and N. In some embodiments the substrate is annealed after cleaning and prior to carrying out the one or more deposition cycles. The dielectric layer may also be treated in a dielectric restoration step after cleaning and prior to deposition. In some embodiments the dielectric restoration step comprises exposing the substrate to one or more silanes.

In some embodiments the first metal surface comprises copper. The second metallic material may comprise a metal nitride or metal silicide. In some embodiments the second metallic material comprises a transition metal, such as tungsten. The second precursor in the deposition cycles may be, for example, a metal halide.

Methods for selectively depositing a film on a substrate comprising a first copper surface and a second dielectric surface are also provided herein. The methods may comprise contacting the substrate with a plasma and subsequently conducting one or more deposition cycles, each comprising contacting the substrate with a first precursor comprising silicon or boron and contacting the substrate with a second precursor comprising a metal fluoride. The temperature of the substrate during the deposition cycles is selected such that the a film forms on the first surface with a selectivity of greater than about 90% relative to the second surface.

In some embodiments, the substrate is an integrated circuit workpiece comprising copper lines with a width of less than about 1 micrometer. The methods may also include a dielectric surface restoration step, such as contacting the substrate with $Si_2H_6$ or trimethylchlorosilane. In some embodiments, different process steps are carried out in different reaction spaces. For example, the substrate may be contacted with plasma in a first reaction chamber while deposition cycles are carried out in a second reaction chamber.

In some embodiments, methods for selectively depositing a film on a first metal surface of a substrate relative to a second dielectric surface are provided. The substrate may be cleaned prior to deposition, for example with a plasma comprising noble gas. In some embodiments the gas used in the plasma cleaning process comprises only argon. The cleaning may serve to remove a passivation layer from the first metal surface. After cleaning, a film is selectively deposited on the first metal surface relative to the second dielectric surface. The film may comprise, for example, a metal nitride or metal silicide. Selectivity for deposition on the first metal surface relative to the second dielectric surface may be greater than about 50% or even greater than 70%, 80% or 90% in some embodiments. In some embodiments, the second dielectric surface has not been treated to block deposition prior to selective deposition. Thus, in some embodiments the second dielectric surface does not comprise a blocking layer or passivation layer when the film is selectively deposited.

In some embodiments, selective deposition comprises alternately exposing the substrate to a first reactant and a second reactant, where the second reactant is different from the first reactant. The methods may also comprise a dielectric surface restoration step. For example, the dielectric surface may be contacted with one or more silanes after the cleaning and prior to deposition. In other embodiments a dielectric restoration step may be carried out after deposition. In addition, in some embodiments the substrate may be annealed after cleaning and prior to deposition, for example at about 150 to about 400° C.

DETAILED DESCRIPTION OF THE PREFERRED EMBODIMENT

Figure 1:
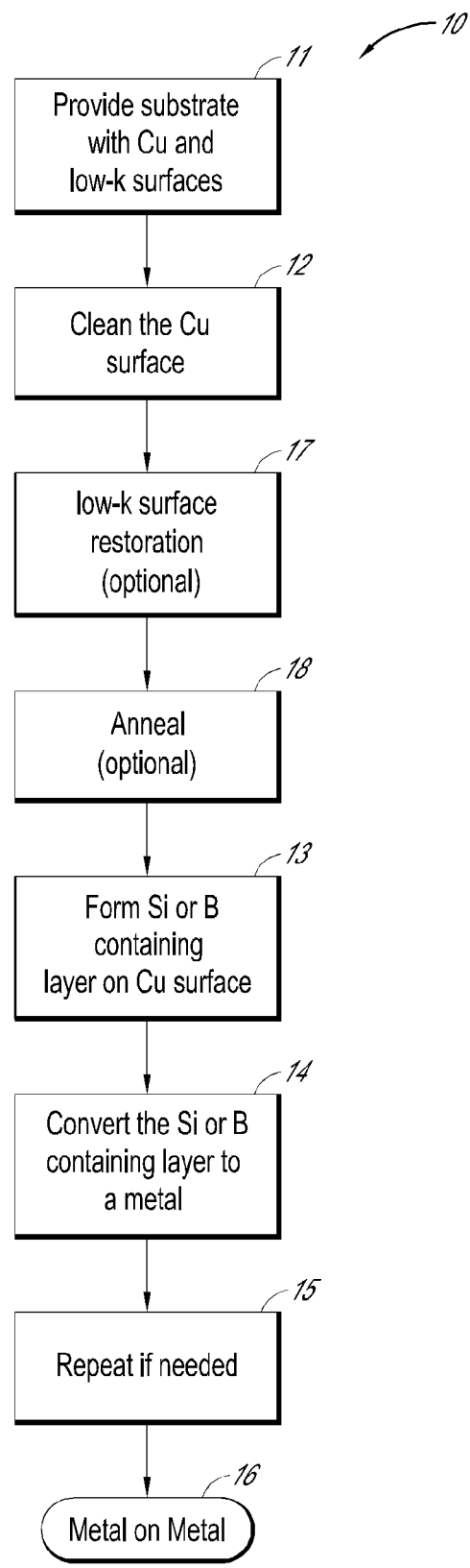
FIG. 1 is a flow chart generally illustrating a method for forming a metal film in accordance with one embodiment

In some embodiments, methods are disclosed for selective deposition of metallic films on metal or metallic materials while avoiding deposition on dielectric materials, such as a low-k material. For example, a metallic film may be deposited on copper for end of the line substrate processing. In some embodiments, metallic films are deposited on an integrated circuit workpiece comprising copper lines in dielectric material.

In some such applications, the selective deposition methods disclosed herein can be used to deposit material onto copper thereby decreasing electromigration of the copper. In some embodiments, the selective deposition is on the copper metal layers and not on dielectric materials on the substrate. Deposition on the dielectric materials in these applications is undesirable because it can decrease the effective dielectric value.

In some embodiments, the process flows described herein are used to selectively deposit metal on micrometer-scale (or smaller) features during integrated circuit fabrication. In some embodiments feature size may be less than 100 micrometers, less than 1 micrometer or less than 200 nm. In the case of selective deposition of W on Cu for interconnect applications, in some embodiments the feature size/line widths may be less than 1 micrometer, less than 200 nm, less than 100 nm, or even less than 50 nm. Of course the skilled artisan will recognize that selective deposition on larger features and in other contexts is possible using the disclosed methods.

In some embodiments, the selective deposition can avoid additional processing steps, thereby saving time and decreasing the costs associated with processing the substrates. For example, lithography will be very expensive in the future for small dimensions. With 8 or more layers of Cu metallization in the chips, the time and cost savings achievable using selective deposition are magnified because time is saved for each area of copper metallization during substrate processing. Also, the methods disclosed herein can obviate the need for dielectric diffusion barriers and other processing steps In some embodiments the methods comprise selectively depositing a film on a substrate comprising a first metal surface and a second dielectric surface using a plurality of deposition cycles. The cycle comprises: contacting the substrate with a first precursor comprising silicon or boron to selectively form a layer of first material comprising Si or B over the first metal surface relative to the second dielectric surface; and converting the first material to a second metallic material by exposing the substrate to a second precursor comprising metal. The selective deposition involves forming a greater amount of material on the first metal surface relative to the second dielectric surface. The selectivity can be expressed as the ratio of material formed on the first surface to amount of material formed on the first and second surfaces combined. For example, if a process deposits 10 nm of W on a first copper surface and 1 nm on a second low-k surface, the process will be considered to have 90% selectivity. Preferably, the selectivity is above about 80%, more preferably above 90%, even more preferably above 95%, and most preferably about 100%. In some cases selectivity above 50% is acceptable. In some embodiments, multiple deposition cycles are used to deposit material. In some embodiments the selectively deposited film is a metallic layer. The metallic layer may be elemental metal. In some embodiments, the metallic layer can include additional elements, such as Si, B, N, and dopants. Thus, in some embodiments the metallic layer is a metal nitride or metal silicide. As used herein, "metallic" indicates that a film, reactant or other material comprises one or more metals.

Selective deposition using the methods described herein does not require treatment of the dielectric layer to block deposition thereon. As a result, in some embodiments the second dielectric surface does not comprise a passivation or blocking layer, such as a self-assembled monolayer (SAM), that would prevent the actual top surface of the second dielectric surface from being exposed to the chemicals of the deposition processes described herein. Thus, in some embodiments the film is deposited selectively on the first metal surface on a substrate which has not received treatment designed to prevent deposition of the film on the second dielectric surface, such as a blocking or passivation treatment. That is, in some embodiments selective deposition can be obtained even though deposition is not blocked on the second dielectric surface by a blocking or passivation layer. Instead, the deposition conditions are selected such that the selective deposition process will occur without the need for pretreatment of the second dielectric surface prior to deposition.

However, in some embodiments the second dielectric layer may be treated. For example, in some embodiments it is desirable to passivated the first metal surface and the second dielectric surface may be exposed to the same passivation treatment as the first metal surface. For example, in the case of Cu both the first Cu surface and the second dielectric surface may be exposed to BTA or other passivating chemical. However, no specific further treatments or exposures (besides what it may receive during transportation of the sample) are done for the second dielectric surface before a cleaning step to remove the passivation layer from the metal surface. In particular no treatment designed to block deposition of the film on the second dielectric surface need be carried out.

In some embodiments at the time of selective deposition of the film, the second dielectric surface comprises only surface groups that are naturally occurring in the low-k material, and does not comprise a significant amount of functional groups or ligands that would not naturally be present in the low-k material itself. In some embodiments no active treatment of the second dielectric surface is carried out after cleaning that would add surface groups to the second dielectric surface. In some embodiments the second dielectric surface comprises only surface groups that are naturally occurring in low-k materials, including those that could be formed during for transportation of the substrate in air, for example.

The substrate can comprise various types of materials. When manufacturing integrated circuits, the substrate typically comprises a number of thin films with varying chemical and physical properties. For example and without limitation, the substrate may comprise a dielectric layer and a metal layer. In some embodiments the substrate can comprise metal carbide. In some embodiments the substrate can comprise a conductive oxide.

Preferably the substrate has a first surface comprising a metal, referred to herein as the first metal surface. In some embodiments the first surface is essentially an elemental metal, such as Cu. In some embodiments the first surface comprises a metal nitride. In some embodiments the first surface comprises a transition metal. The transition metal can be selected from the group: Ti, V, Cr, Mn, Nb, Mo, Ru, Rh, Pd, Ag, Au, Hf, Ta, W, Re, Os, Ir and Pt. In some embodiments the first surface preferably comprises copper. In some embodiments the first surface comprises a noble metal. The noble metal can be selected from the group: Au, Pt, Ir, Pd, Os, Ag, Re, Rh, and Ru.

The second surface is preferably a dielectric surface. In some embodiments, the dielectric comprises $SiO_2$. In some embodiments the dielectric is a porous material. In some embodiments the porous dielectric contains pores which are connected to each other, while in other embodiments the pores are not connected to each other. In some embodiments the dielectric comprises a low-k material, defined as an insulator with a dielectric value below about 4.0. In some embodiments the dielectric value of the low-k material is below about 3.5, below about 3.0, below about 2.5 and below about 2.3.

The precursors employed in the processes disclosed herein may be solid, liquid or gaseous material under standard conditions (room temperature and atmospheric pressure), provided that the precursors are in vapor phase before being conducted into the reaction chamber and contacted with the substrate surface. Plasma conditions can also be used. Thus, plasma can be formed from the vapor phase reactants or precursors in some embodiments. "Pulsing" a vaporized precursor onto the substrate means that the precursor vapor is conducted into the chamber for a limited period of time. Typically, the pulsing time is from about 0.05 to 10 seconds. However, depending on the substrate type and its surface area, the pulsing time may be even higher than 10 seconds. Pulsing times can be on the order of minutes in some cases. In some cases to ensure full saturation of reactions, the precursor might be supplied in multiple shorter pulses rather than in one longer pulse.

The mass flow rate of the precursors can also be determined by the skilled artisan. In one embodiment, for deposition on 300 mm wafers the flow rate of precursors is preferably between about 1 and 1000 sccm without limitation, more preferably between about 100 and 500 sccm.

The pressure in the reaction chamber is typically from about 0.01 to about 20 mbar, more preferably from about 1 to about 10 mbar. However, in some cases the pressure will be higher or lower than this range, as can be readily determined by the skilled artisan.

First Precursor:

In some embodiments a first precursor is provided to the substrate such that a layer is selectively formed on a first metal surface of the substrate relative to a second dielectric surface of the substrate. In some embodiments the first precursor preferably comprises silicon or boron. In some embodiments a 0.05-4 nm thick layer of Si or B is formed on the metal surface of the substrate. In some embodiments a 0.1-2 nm thick layer of Si or B is formed on the metal surface of the substrate. In some embodiments less than 1 nm of Si or B can be used. Without being bound to a theory, it is believed that the metal surface on the substrate can catalyze or assist in the adsorption or decomposition of the first precursor in comparison to the reactivity of the second surface or insulator. In some embodiments the formation of silicon or boron on the metal surface is self-limiting, such that up to a monolayer is formed upon exposure to the reactant. In some embodiments the silicon or boron source chemical can decompose on the copper or metal surface.

In some embodiments, the silicon source chemical is selected from the silane family $Si_nH_{2n+2}$ (n is equal to or greater than 1) or the cyclic silane family $Si_nH_{2n}$ (n is equal to or greater than 3). In some embodiments the silicon source comprises silane or disilane. Most preferably the silane is disilane $Si_2H_6$ or trisilane $Si_3H_8$. In some embodiments the silicon source can be selected from silane compounds having the formula: $SiH_xL_y$, where L is a ligand selected from the groups including: alkyl, alkenyl, alkynyl, alkoxide, and amine. In some cases L is a ligand selected from the halide group: F, Cl, Br and I.

In some embodiments the first precursor comprises boron. In some embodiments the first precursor is diborane ($B_2H_6$). Diborane has similar properties to some of the silane based compounds. For example, diborane has a lower decomposition temperature than disilane but similar thermal stability to trisilane (silcore).

Other precursors comprising boron could also be used. The availability of a vast number of boron compounds makes it possible to choose one with the desired properties. In addition, it is possible to use more than one boron compound. Preferably, one or more of the following boron compounds is used:

Boranes according to formula I or formula II.

$$B_nH_{n+x} \qquad (I)$$

Wherein n is an integer from 1 to 10, preferably from 2 to 6, and x is an even integer, preferably 4, 6 or 8.

$$B_nH_m \qquad (II)$$

Wherein n is an integer from 1 to 10, preferably from 2 to 6, and m is an integer different than n, from 1 to 10, preferably from 2 to 6.

Of the above boranes according to formula I, examples include nido-boranes ($B_nH_{n+4}$), arachno-boranes ($B_nH_{n+6}$) and hyph-boranes ($B_nH_{n+8}$). Of the boranes according to formula II, examples include conjuncto-boranes ($B_nH_m$). Also, borane complexes such as $(CH_3CH_2)_3N$—$BH_3$ can be used.

Borane halides, particularly fluorides, bromides and chlorides. An example of a suitable compound is $B_2H_5Br$. Further examples comprise boron halides with a high boron/halide ratio, such as $B_2F_4$, $B_2Cl_4$ and $B_2Br_4$. It is also possible to use borane halide complexes.

Halogenoboranes according to formula III.

$$B_nX_n \qquad (III)$$

Wherein X is Cl or Br and n is 4 or an integer from 8 to 12 when X is Cl, or n is an integer from 7 to 10 when X is Br.

Carboranes according to formula IV.

$$C_2B_nH_{n+x} \qquad (IV)$$

Wherein n is an integer from 1 to 10, preferably from 2 to 6, and x is an even integer, preferably 2, 4 or 6.

Examples of carboranes according to formula IV include closo-carboranes ($C_2B_nH_{n+2}$), nido-carboranes ($C_2B_nH_{n+4}$) and arachno-carboranes ($C_2B_nH_{n+6}$).

Amine-borane adducts according to formula V.

$$R_3NBX_3 \quad (V)$$

Wherein R is linear or branched C1 to C10, preferably C1 to C4 alkyl or H, and X is linear or branched C1 to C10, preferably C1 to C4 alkyl, H or halogen.

Aminoboranes where one or more of the substituents on B is an amino group according to formula VI.

$$R_2N \quad (VI)$$

Wherein R is linear or branched C1 to C10, preferably C1 to C4 alkyl or substituted or unsubstituted aryl group.

An example of a suitable aminoborane is $(CH_3)_2NB(CH_3)_2$.

Cyclic borazine (—BH—NH—)$_3$ and its volatile derivatives.

Alkyl borons or alkyl boranes, wherein the alkyl is typically linear or branched C1 to C10 alkyl, preferably C2 to C4 alkyl.

In some embodiments the first precursor comprises germanium. In some embodiments, the germanium source chemical is selected from the germane family $Ge_nH_{2n+2}$ (n is equal to or greater than 1) or the cyclic germane family $Ge_nH_{2n}$ (n is equal to or greater than 3). In some preferred embodiments the germanium source comprises germane $GeH_4$. In some embodiments the germanium source can be selected from germane compounds having the formula: $GeH_xL_y$, where L is a ligand selected from the groups including: alkyl, alkenyl, alkynyl, alkoxide, and amine. In some cases L is a ligand selected from the halide group: F, Cl, Br and I.

Metal Source Chemicals

Preferably the second reactant comprises a metal. In some embodiments the metal is a transition metal. The transition metal can be selected from the group of: Ti, V, Cr, Mn, Nb, Mo, Ru, Rh, Pd, Ag, Hf, Ta, W, Re, Os, Ir and Pt. In some embodiments the second reactant comprises W, Ta, Nb, Ti, Mo or V. In some embodiments the second reactant preferably comprises tungsten.

In some embodiments the second reactant comprises a noble metal. The noble metal can be selected from the group: Au, Pt, Ir, Pd, Os, Ag, Rh, and Ru.

In some embodiments the second reactant comprises a metal halide (F, Cl, Br, I). In some preferred embodiments the second reactant comprises a transition metal halide. In some embodiments the second reactant preferably comprises fluorine. In some embodiments, the second reactant comprises $WF_6$, $TaF_5$, $NbF_5$, $TiF_4$, $MoF_x$, $VF_x$. In some embodiments the second reactant comprises $WF_6$.

The second reactant can be used to form a variety of different materials on the substrate. In some embodiments the second reactant reacts with the first reactant on the substrate to form a metallic material on the substrate. Any of the metals disclosed above for the second reactant can be in the film deposited on the substrate.

In some embodiments an elemental metal film can be formed. In some embodiments a metal nitride film can be formed. In some embodiments a metal silicide film can be formed.

In some embodiments a metallic or elemental metal film is first formed through reaction of the Si or B on the substrate surface and the second reactant and later converted to a corresponding metal silicide or metal nitride through further processing. For example, the first metallic or elemental metal film may be exposed to a third reactant to convert it to a metal silicide or metal nitride.

In some embodiments further processing of the metallic material can be done to dope the metallic material or convert the metallic material to a metal nitride or metal silicide. In some embodiments, for example, the material can be converted to a corresponding metal nitride using plasma or a $NH_3$-treatment. In some embodiments an electrically conductive metallic material can be converted to a more electrically resistive material or to a dielectric material by using different treatments and depending on the starting metallic material.

In some embodiments multiple pulses of one of the reactants can be provided prior to providing the next reactant. In some embodiments, any excess reactants can be removed prior to the provision of the next reactant. In some embodiments the process chamber can be purged prior to provision of the next reactant.

In some embodiments vapor phase precursors can be provided to the reaction space with the aid of an inert carrier gas. Removing excess reactants can include evacuating some of the contents of the reaction space or purging the reaction space with helium, nitrogen or any other inert gas. In some embodiments purging can comprise turning off the flow of the reactive gas while continuing to flow an inert carrier gas to the reaction space.

Deposition Temperature:

In some embodiments the temperature is selected to facilitate the selective deposition. Deposition is generally defined as selective if the amount of the deposited material per surface area or volume (e.g. at/cm$^2$ or at/cm$^3$) on the first surface is greater than the amount of the deposited material per surface area or volume on the second surface. The amount of material deposited on the surfaces can be determined by measuring the thicknesses of each layer. In some cases, the thickness measurement might not be possible due to non-continuous film. In some cases the selectivity can be determined by measuring the deposited atoms per surface area or volume. As mentioned above, the selectivity can be expressed as the ratio of material formed on the first surface to amount of material formed on the first and second surfaces combined. Preferably, the selectivity is above about 70%, above about 80%, more preferably above 90%, even more preferably above 95%, and most preferably about 100%. In some cases selectivity above 50% is acceptable.

In some embodiments the deposition temperature is selected such that the selectivity is above about 90%. In some embodiments, the deposition temperature is selected such that a selectivity of about 100% is achieved.

In some embodiments, the deposition temperature is selected such that the first precursor comprising silicon or boron forms a layer containing silicon or boron on the first metal surface. In some embodiments the first precursor does not form a layer on the second low-k surface, or forms a less than a complete layer on the second surface.

The particular temperature utilized can depend, in part, on the silicon or boron precursor that is selected along with the first surface or metal and the second surface or dielectric on the substrate. Preferably, the silicon or boron source forms on the first metal surface instead of the second dielectric surface to form a layer comprising silicon or boron. Preferably, the layer comprising silicon or boron is about a monolayer or less. In some cases, more than a monolayer of silicon or boron can be formed. In some embodiments a 0.05-4 nm thick layer of silicon or boron is formed on the metal surface of the substrate. In some embodiments preferably a 0.1-2 nm thick layer of silicon or boron is formed on the metal surface of the substrate. In some embodiments the formation of silicon or boron on the metal surface is self-limiting. In some embodiments the layer comprising silicon or boron is formed by decomposition.

In some cases the silicon or boron layer can form on both the metal and dielectric surfaces at higher temperatures. In such situations, the use of lower temperatures is preferred because the silicon or boron can form on the metal surface at a lower temperature than the dielectric surface. Thus, the temperature can be selected such that the silicon precursor interacts preferentially with the first surface or metal surface relative to the second surface or dielectric surface.

In some embodiments deposition temperatures are selected to achieve the desired level of selectivity. For example, a temperature can be selected such that absorption of the silicon or boron containing precursor to the low-k material is limited to an amount necessary to achieve a desired level of selectivity.

The deposition temperature can be selected based on the silicon or boron source and the particular substrate surfaces that are used (e.g. low k surface and copper surface).

In some embodiments the deposition temperature is preferably less than 200° C., more preferably less than about 175° C., and most preferably less than about 150° C. In some cases temperatures of less than about 100° C. can be used. However, at temperatures below about 100° C. a careful dosing of the precursors and optimization of the process may be used to achieve uniform films. In some embodiments the deposition temperature range for selective deposition having selectivity of over 50% in films having thicknesses of less than about 5 nm (e.g. W thickness) deposited using disilane and $WF_6$ is from about 50° C. to about 200° C. In some embodiments desirable levels of uniformity and selectivity can be achieved using deposition temperature ranges from about 100° C. to about 150° C. In these temperature ranges a person skilled in the art can optimize the process to achieve desired or acceptable uniformity and selectivity for the films deposited using a particular reactor with particular precursors.

In some embodiments the silicon or boron-containing precursor and the second metal precursor are provided at the same temperature and in the same reaction space. In some embodiments the silicon precursor is provided at a first deposition temperature and the second metal reactant is provided at a second deposition temperature. In practice, this may mean providing the first reactant in a first reaction space and providing the second metal reactant in a second reaction space.

In one embodiment, when using a silicon containing precursor, such as disilane, and depositing on a copper surface a selectivity of more than about 90% relative to a dielectric surface can be achieved with a deposition temperature of about 130° C., for example about 130±15° C. In some embodiments, when using a silicon containing precursor, such as disilane, and depositing tungsten on a copper surface a selectivity of more than about 80% relative to a dielectric surface can be achieved, for example using a deposition temperature from about 100 to about 150° C. In some embodiments, when using a silicon containing precursor, such as disilane, and depositing on a copper surface a selectivity of more than about 50% relative to a dielectric surface can be achieved with a deposition temperature from about 80 to about 175° C. In other embodiments using disilane and depositing on a copper surface, a selectivity of more than about 95% relative to a dielectric can be achieved with a deposition temperature of below about 160° C. In other embodiments using disilane and depositing tungsten using $WF_6$ on a copper surface, a selectivity of more than about 80%, preferably more than about 90%, relative to a dielectric can be achieved with a deposition temperature of below about 150° C. In some such embodiments the deposition temperature may be below about 140° C., 130° C. or 120° C. The deposition temperature for trisilane can be even lower than the deposition temperature for disilane. In the above mentioned embodiments the deposited film may be, for example and without limitation, a tungsten film.

In some embodiments the thickness of the film that is selectively deposited is less than about 10 nm, less than about 5 nm, about 4 nm or less or, in some embodiments, from about 1 nm to about 4 nm. However, in some cases a desired level of selectivity, for example more than 50%, more preferably more than 80%, is achieved with the thicknesses of the selectively deposited film being over about 10 nm.

In some embodiments a W film having a thickness of about 10 nm or less is deposited selectively over Cu on a substrate surface with a selectivity of greater than 50% relative to a low-k dielectric material.

In some embodiments a W film having a thickness of about 5 nm or less is deposited selectively over Cu on a substrate surface with a selectivity of greater than about 80% relative to a low-k dielectric material.

In some embodiments a W film having a thickness of about 3 nm or less is deposited selectively over Cu on a substrate surface with a selectivity of greater than about 90% relative to a low-k dielectric material.

If a lower selectivity is preferred the temperature can be slightly higher than the temperature for processes that achieve more than 90% selectivity.

In some embodiments, deposition conditions and/or reactants are selected such that etching of the low-k surface is avoided or minimized. For example, at higher temperatures metal fluorides can start fluorinating the Si—OH groups and in some cases they can etch the low-k. Thus in some embodiments the deposition temperature is selected so that etching of the low-k dielectric is avoided or eliminated.

The substrate temperature during the provision of the second reactant can be the same as the temperature during the provision of the silicon or boron containing reactant. In other embodiments, different temperatures may be used.

In embodiments where $WF_6$ is used as the second reactant with disilane as the first reactant a temperature of about 150° C. can be used.

In some embodiments, the temperature of the substrate can be increased when providing the second reactant to increase the conversion of the metal reactant. For example, a higher temperature can be used when $TaF_5$ and $NbF_5$ are used as the second reactant. For example, when using $TaF_5$ the temperatures can be over about 300° C. When using $NbF_5$ the temperature can be above about 250° C. This can be accomplished by heating the substrate, using a higher reaction temperature for the second material or other means known to the skilled artisan.

Surface Cleaning

In some embodiments the substrate surface is cleaned prior to beginning the deposition process. For example, for embodiments when the first material is copper, the copper surface can be cleaned or reduced such that pure elemental copper is on the substrate surface. An example of an embodiment in which a copper surface is cleaned prior to deposition is illustrated at step 12 in FIG. 1.

The cleaning step can be done in any of a variety of methods, for example using a chemical such as citric acid or plasma. For example, the substrate surface may be cleaned using hydrogen containing plasma or radicals, such as H-plasma or $NH_3$-plasma. In some embodiments HCl treatment is used as the cleaning method. Other cleaning methods are also possible. The specific cleaning method to be used in any particular case can be selected based on a variety of factors such as the materials and the deposition conditions, including, for example, the types of materials on the substrate surface.

In some cases a first material on which selective deposition is desired, such as copper, is passivated. The passivation may be the result of an intentional treatment of the substrate to form the passivation layer, or may result from the processing conditions, such as exposure to oxygen during transport of the substrate.

The surface(s) of the substrate may be passivated, for example, prior to transfer from one reaction space to another. In some embodiments the surface of the first material may be passivated against oxidation in air using any of a variety of known passivation chemicals. In some embodiments in which selective deposition on Cu is desired, the Cu surface may be passivated, for example with BTA (benzotriazole). This passivation can be removed with the cleaning methods described herein.

In some embodiments, a passivation layer, such as a passivation layer on Cu, is removed by cleaning with plasma consisting only of Ar. In other embodiments a passivation layer o is removed with Ar and H-containing plasma. In other embodiments a passivation layer is removed with Ar and H and N-containing plasma. It may be noted that instead of Ar, other noble gases, such as He, Ne, Kr or Xe could possibly be used in substantially same conditions. In some embodiments more than one type of plasma may be used. For example, one or more of Ar-containing plasma, Ar and H-containing plasma and Ar, H and N-containing plasma may be provided. In some embodiments all three types of plasma are provided consecutively.

In some embodiments utilizing Ar-containing plasma, Ar may be provided, for example, from about 1 to about 3000 sccm, more preferably from about 300 to about 1500 sccm, and most preferably from about 1000 to about 1300 sccm. In some embodiments utilizing H-containing plasma, $H_2$ may be provided, for example, from about 1 to about 500 sccm, more preferably from about 10 to about 200 sccm, and most preferably from about 30 to about 100 sccm. In some embodiments utilizing N-containing plasma, $N_2$ may be provided, for example, at about from about 1 to about 500 sccm, more preferably from about 5 to about 200 sccm, and most preferably from about 5 to about 30 sccm. Similar conditions can be used for other types of plasma.

In some embodiments plasma may be generated at a power of less than about 1500 Watts, for example about 1 to about 1000 Watts, about 1 to about 500 W, or about 1 to about 200 W or less.

In some embodiments the plasma is provided for less than about 200 s, for example about 180 s or less, about 60 s or less, or about 30 s or less.

Temperature during the surface cleaning may be, for example, from about room temperature to about 150° C., or from about 100 to about 130° C.

In some embodiments, conditions for surface cleaning are selected such that etching of the low-k surface is avoided or minimized.

Dielectric Surface Treatment

In some embodiments, the dielectric material on which deposition is to be avoided can be treated prior to deposition. For example, in some embodiments the dielectric material may be treated after a surface cleaning and prior to deposition. In some embodiments, a dielectric or insulator surface can be treated to enhance the selectivity of the deposition process by decreasing the amount of material deposited on the dielectric or insulator surface. In some embodiments the treatment is intended to restore the dielectric layer and not to block deposition on the dielectric layer.

In some embodiments the dielectric or insulator surface is a low-k surface, which has been outgassed to remove moisture absorbed from the atmosphere.

In some embodiments the treatment of the dielectric or insulator is a dielectric restoration step. Different kinds of dielectric restoration steps can be performed before the selective deposition and after the surface has been cleaned (if carried out).

In some embodiments the dielectric surface is treated by contacting the dielectric surface with one or more silanes, such as disilane. In some embodiments the low-k is treated with trimethylchlorosilane $(CH_3)_3SiCl$ (TMCS) or with other type of alkylhalosilanes having formula $R_{3-x}SiX_x$, wherein x is from 1 to 3 and each R can independently be selected to be C1-C5 hydrocarbon, such as methyl, ethyl, propyl or butyl, preferably methyl, and X is halide, preferably chloride. U.S. Pat. No. 6,391,785 discloses various surface modifications and treatments and is incorporated herein in its entirety. In some embodiments any of the surface modifications or treatments disclosed in U.S. Pat. No. 6,391,785 can be used in the methods disclosed herein.

In some embodiments, the restoration chemical is selected from the silane family and has the chemical formula $Si_nH_{2n+2}$ (n is equal to or greater than 1), or the cyclic silane family and has the chemical formula $Si_nH_{2n}$ (n is equal to or greater than 3). In some embodiments the restoration chemical is a silicon source comprising silane or disilane. In some embodiments the silane is disilane $Si_2H_6$ or trisilane $Si_3H_8$. In some embodiments the silicon source can be selected from silane compounds having the formula: $SiH_xL_y$, where L is a ligand selected from the groups including: alkyl, alkenyl, alkynyl, alkoxide, and amine. In some cases L is a ligand selected from the halide group: F, Cl, Br and I.

In some embodiments a dielectric surface restoration step is carried out prior to selective deposition by exposing the substrate to one or more restoration chemicals, such as $Si_2H_6$ or TMCS, at a temperature of about room temperature to about 150° C., or about 100° C. to about 130° C. In some embodiments a restoration chemical, such as $Si_2H_6$, is provided to the reaction chamber at a flow rate of about 5 to 100 sccm, or about 30 to 60 sccm. In some embodiments the restoration chemical is provided to the reaction chamber for about 1 to 20 s, or about 1 to 10 s. In some embodiments a restoration chemical, such as TMCS, is provided in pulses. About 1-20 or about 1-10 pulses may be provided, for example with a pulse and purge time of about 1 to 10 seconds each.

While this step is called a surface restoration step, and the chemicals used are called restoration chemicals, these designations are used herein for simplicity and no particular restorative function is implied. Thus, in some embodiments the treatment and/or chemicals may not fully or even partially restore a dielectric surface.

If the dielectric surface is damaged, it may also be restored after selective deposition steps by conducting a surface restoration step.

Some dielectric materials can have porous structures. In order to avoid diffusion, etching, and other undesirable processes the pores can be sealed or terminated with protective groups prior to beginning the deposition process. Thus, in some embodiments a porous dielectric material can be treated to seal the pores or terminate with a protective group prior to beginning the selective deposition. In some embodiments the porous dielectric material is treated prior to providing a metal reactant.

In some embodiments the pores are sealed via silylation, i.e., forming —$Si(CH_3)_3$ groups on the low-k surface. Etching can in part be avoided by silylation prior to introducing metal fluoride or other reactants. Silylation can also be used to block the low-k pores to avoid reactant penetration into the low-k. In some embodiments silylation is accomplished through the reaction of a silicon compound, for instance Cl—Si(CH$_3$)$_3$, with an Si—OH terminated surface of a low-k material: Si—OH+Cl—Si(CH$_3$)$_3$→Si—O—Si(CH$_3$)$_3$+HCl. Thus, in some embodiments an appropriate surface termination is formed prior to providing the silicon compound. Also the use of silicon compounds with longer carbon containing ligands is possible.

Methods for sealing the pores are disclosed, for example, in U.S. Pat. No. 6,759,325. The disclosure of sealing methods in U.S. Pat. No. 6,759,325 is hereby incorporated by reference in its entirety.

In some embodiments an organic layer can be formed by ALD on the low-k material prior to deposition to block the pores and to make the low-k surface more resistant to metal fluorides.

In some embodiments where the selectivity is imperfect or a higher selectivity is desired, the surface can be treated after selective deposition, for example using an isotropic selective metal etch, to remove material from the insulator surface without fully removing material from the metallic surface. For example, HCl vapor or a wet etch can be used.

Exemplary Process Flows

FIG. 1 is a flow chart 10 in accordance with one embodiment. A substrate with a metal (copper) surface and a low-k surface is first provided 11. Next, the Cu surface is cleaned 12, for example to remove oxide or other passivation layer. The copper surface can, for example, be reduced to pure Cu by H$_2$ plasma at low temperatures without destroying the low-k surface.

In some embodiments, cleaning of the substrate surface 12 is followed by an optional low-k surface restoration step 17, as discussed above. For example, the low-k surface may be contacted with a silicon-containing restoration chemical, such as a silane.

In some embodiments the substrate surface is optionally further annealed in an inert atmosphere 18 after the low-k treatment step 17. The annealing is carried out at a temperature that is higher than the temperature during the cleaning step 12 or the following tungsten deposition steps 13-15. The temperature for the annealing step 18 is preferably from about 150 to about 400° C., from about 150 to about 300° C., or from about 200 to about 275° C. and in some cases at about 250° C. Without being held to any theory, it is believed that this heat treatment step may enhance the cleaning step 12, for example by enhancing the removal of any passivation chemical or layer, and thus enhance selectivity. Annealing may be carried out even if a dielectric or low-k treatment step is not conducted in a particular embodiment.

Next, a silicon or boron source is provided to the substrate, such that a silicon or boron containing species is deposited on the Cu surface 13. In some embodiments the silicon source is disilane. In some embodiments, the disilane can be selectively decomposed on the Cu surface relative to the low-k surface using a temperature at which the silicon precursor forms silicon on the copper surface but does form silicon on the hydrophobic low-k surface. In some embodiments, the silicon or boron source reacts with the copper surface in a self-limiting manner. It is believed that the Cu surface can facilitate the formation of silicon relative to the formation on the low-k surface. Silicon dioxide based surfaces like the low-k (SiOC) surfaces are not catalytically active relative to metal surfaces.

In some embodiments a 0.05-4 nm thick layer comprising silicon or boron is formed on the metal surface of the substrate in each deposition cycle. In some embodiments a 0.1-2 nm thick layer comprising silicon or boron is formed on the metal surface of the substrate in each cycle. In preferred embodiments the formation of a layer comprising silicon or boron on the metal surface is self-limiting. Thus, at most a monolayer comprising silicon or boron is formed in each cycle.

After the silicon or boron containing layer is formed on the copper layer a second reactant, such as a metal halide, is used to convert 14 the layer comprising silicon or boron to a layer comprising the corresponding metal from the second reactant, such as the metal in the metal halide. In some embodiments, WF$_6$, TaF$_5$, NbF$_5$ or other compounds that are able to react with the Si or B layer are introduced to the substrate surface to form a metallic layer or metal silicide. In some embodiments, the silicon or boron precursor (e.g. disilane) and second reactant (such as metal halide) pulses can be repeated 15 to form a metallic layer 16 with a desired thickness. In some embodiments the metallic layer is elemental metal. In some embodiments, the metallic layer can include additional elements, such as Si, B, N, and dopants. In some embodiments the metallic layer is further treated to form a different material. For example an elemental metal layer can be treated using a third reactant to form a metal nitride or metal silicide.

The deposition cycle can be defined as providing the silicon or boron precursor and providing the second metal reactant. In some embodiments no other reactants are provided in the deposition cycle. In some embodiments the deposition cycle is repeated to form a metallic layer with a desired thickness. In some embodiments a 0.05-4 nm thick metallic layer is formed in each cycle. In some embodiments, preferably a 0.1-2 nm thick metallic layer is formed in each cycle. In some embodiments the metallic layer has a thickness of 1-2 nm. In other embodiments the thickness of the deposited metallic layer is above about 2 nm, in some cases above about 30 nm, and in some cases above about 50 nm. In preferred embodiments the layer has thickness of less than 10 nm.

In some embodiments the deposition cycle is repeated 10 or more times. In some embodiments, the deposition cycle is repeated at least 50 times. In some embodiments the deposition cycle is repeated about 100 times or more. The number of cycles can be selected based on the desired thickness of the metallic layer.

In some embodiments, no other reactants are provided besides the precursor comprising silicon or boron and the second metal reactant.

In some embodiments the material in the first surface, such as copper, is not converted or reacted to form another compound during the selective deposition cycle.

In some embodiments, after the one or more deposition cycles are completed a half deposition cycle can be performed. For example, a silicon or boron precursor pulse or alternatively a second metal reactant can be provided. In some embodiments, after the one or more deposition cycles a silicon or boron precursor pulse is provided. When a silicon or boron precursor pulse (or other metal reactant) is provided, the formed material can form a sacrificial layer of silicon oxide or boron oxide (or metal oxide) when exposed to air or an oxygen containing atmosphere. The sacrificial layer can prevent the metallic material underneath the silicon oxide or boron oxide layer from oxidizing when exposed to air or an oxygen-containing atmosphere outside the reactor. The formed silicon oxide or boron oxide layer can be removed in further processing steps, for example with a single pulse of metal source chemicals described herein, preferably with $WF_6$, $TaF_5$, $NbF_5$, $TiF_4$, $MoF_x$ or $VF_x$ and more preferably with $WF_6$.

In some embodiments the entire process flow is carried out in a single reaction chamber; for example in a single process module. However, in other embodiments the various steps are carried out in two or more reaction chambers. For example, in some embodiments the cleaning 12 and surface restoration (if used) are carried out in a first reaction chamber. If the optional heat anneal step is needed or desired, the substrate may then be transported to a second reaction chamber where the heat anneal 18 (if used) and selective deposition 13-15 are carried out. In some embodiments the anneal step 18 is carried out in a second reaction chamber, and the substrate is transported back to the first reaction chamber, or to a third reaction chamber where selective deposition 13-15 is carried out. In some embodiments the cleaning and surface restoration (if used) are carried out in first reaction chamber and the selective deposition is carried out in a second, different reaction chamber without the heat anneal step in between the cleaning and depositions step. The substrate may be cooled down for a period of time prior to transport, if required. In some embodiments, the cool down is carried out for about 0 to 30 min, or about 0 to 10 minutes, at a pressure ranging from vacuum to about 2 atm, or about 0.1 torr to about 760 torr, or about 1 torr to about 760 torr. The substrate may be transported, for example, under vacuum or in the presence of $N_2$ (and possibly some $O_2$) at about 1 to 1000 torr.

The following non-limiting examples illustrate certain preferred embodiments of the invention. They were carried out in an ASM Pulsar® 2000 cross-flow ALD-reactor supplied by ASM Microchemistry Oy, Espoo.

EXAMPLE 1

To selectively deposit a metallic layer on a metal surface, for example, the surface is preferably very clean. The cleaning may be conducted via gas or liquid phase. Specifically for copper, citric acid or some other later-generation cleaning agents may be used in the liquid phase to remove the commonly employed benzotriazole (BTA) passivating agent from the surface. Alternatively, $NH_3$ or $N_2/H_2$ containing plasma may be used as a gas phase approach to remove the BTA layer. Finally, H-radicals are used to ensure the surface is void of any oxidized copper.

Figure 2:
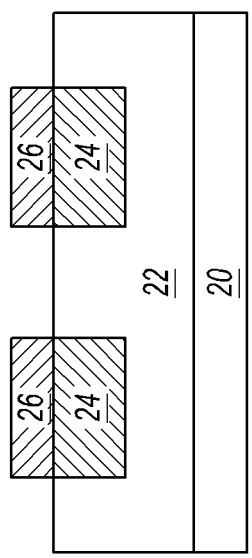
FIG. 2 is a schematic example illustrating a method for selectively forming a metal film on a copper portion of a substrate in accordance with one embodiment.
Figure 2:
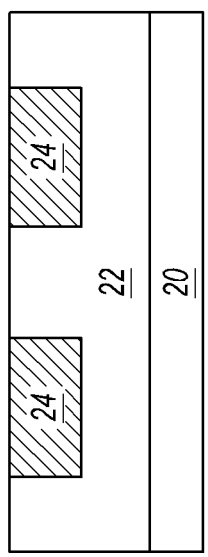
Figure 3:
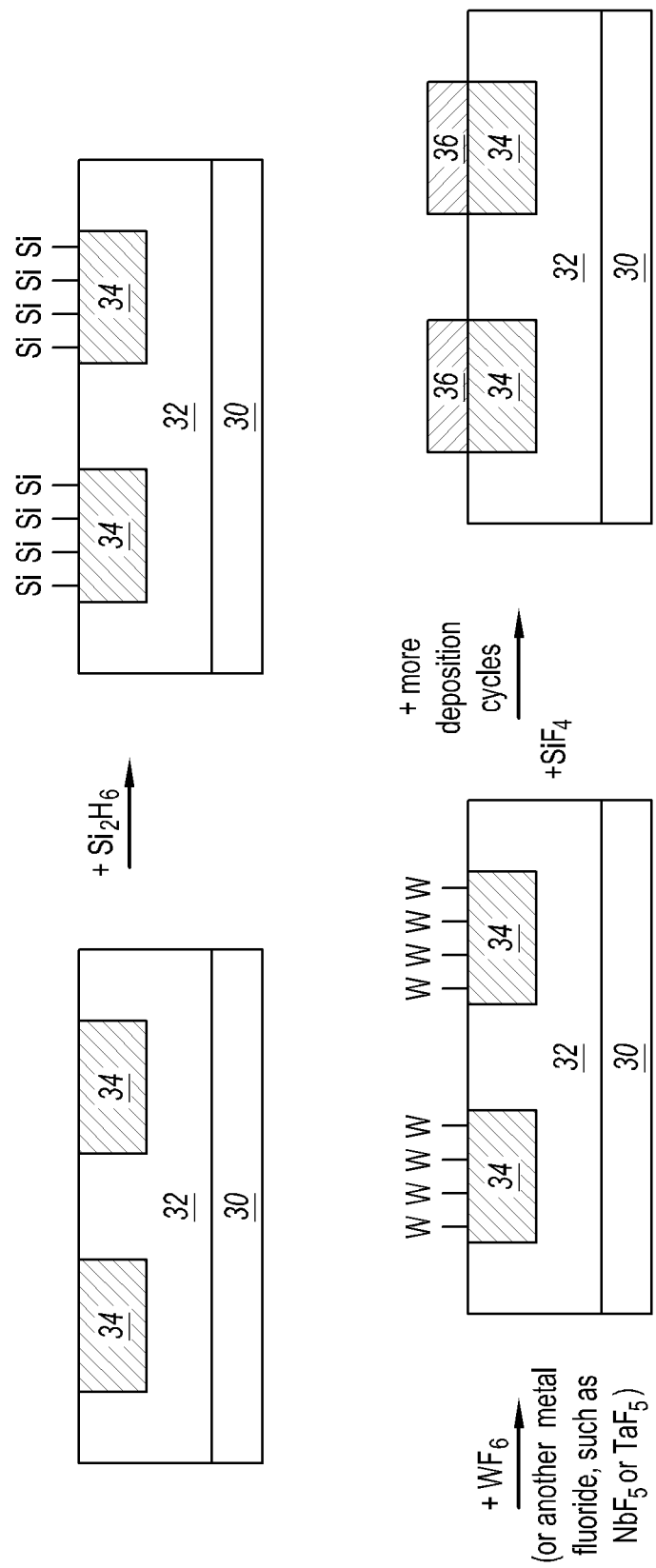
FIG. 3 is a schematic example illustrating a method for selectively forming a Tungsten (W) film on a copper portion of a substrate using disilane and $WF_6$ in accordance with one embodiment.

FIGS. 2 and 3 show schematic representations in accordance with some embodiments. FIG. 2 illustrates a substrate 20 with a silicon dioxide 22 insulating region and a copper surface 24. Selective deposition (not shown) is performed to deposit metal 26 on the copper regions 24 of the substrate while avoiding deposition on the $SiO_2$ 22.

FIG. 3 shows a schematic representation of a selective deposition process using disilane and $WF_6$. The substrate 30 has a silicon dioxide surface 32 and copper surface 34. The cleaned, pure copper surface 34 is exposed to $Si_2H_6$ (disilane) at 150° C. This temperature is too low to allow spontaneous decomposition of disilane, but high enough that when in the presence of a metal surface the formation of Si on the metal surface will take place. As a result, the copper surface 34 is covered with a layer of silicon.

Next, the silicon layer is converted to a metallic layer by exposing it to a metal fluoride (second reaction step). Suitable fluorides are, for example, $WF_6$, $NbF_5$, and $TaF_5$. Of these, $WF_6$ is reactive enough to undergo the reaction at 150° C. In the case of other metal fluorides, elevated temperatures may be required for the second reaction step. As illustrated, in FIG. 3 the $WF_6$ reacts with the deposited silicon to form $SiF_4$ which leaves the substrate surface and deposits tungsten. After this step, the film deposition has completed a full cycle, an additional cycle can continue with the first step, if desired. Continuing with more deposition cycles will produce a thicker metal layer 36 on the metallic substrate. The selectivity will be retained and no film will be deposited on two variants of a low-k $SiO_2$: Low-K 3.0 and Low-K 2.3.

EXAMPLE 2

A copper piece was cut and cleaned with citric acid. The citric acid solution was prepared by mixing approximately 5 g of citric acid crystals in 50 ml of water. The solution was stirred until all crystals had dissolved. A fresh solution was prepared for each film deposition run and discarded immediately after use. The copper piece was dipped in the solution, left immersed for 30 seconds, and stirred a few times during that period. The copper piece was then lifted and dried by draining the liquid back into the solution. If the piece was dried by nitrogen blowing, water marks were produced. Finally, the back side of the copper piece was dried by placing the piece on a piece of clean room tissue. The cleaned copper piece was then placed onto an adapter wafer and loaded into a vacuum load lock within three minutes of cleaning.

After loading the copper piece into the vacuum load lock, it was transported by vacuum transport into the reaction chamber. The film deposition took place in an ASM Pulsar® 2000 cross-flow ALD-reactor. The temperature of the reaction chamber was 150° C. and the substrate was left to stabilize for one minute. Next, hydrogen radicals were used for the final cleaning of the copper surface to remove any oxide possibly formed after the cleaning. The overall pressure during the H-radical cleaning step was approximately 0.4 torr, and the $H_2$ flow rate was 400 sccm. The plasma power was 125 W and the H-radical exposure time was 1.5 minutes.

Immediately after the cleaning step, the cleaned surface was exposed to a disilane pulse of 1 s, with a 2 s purge period before the following metal fluoride pulse. The flow rate of disilane was approximately 30 sccm during the pulse. This step produced a silicon layer on the copper surface. This silicon layer was then converted into a layer of metallic tungsten (W) by exposing it to $WF_6$. The $WF_6$ pulse length was 0.6 s with a 2 s purge. $WF_6$ reacts with silicon to produce metallic tungsten on the surface, and volatile $SiF_4$ as long as there is silicon remaining. As a result, a layer of W is formed, with $WF_6$ as the surface species. If the deposition is continued with a disilane pulse, $SiF_4$ is initially formed followed by formation of Si on the metal surface, this time facilitated by the tungsten surface. The deposition may be continued at least up to 35 nm thick layer of W while maintaining the selectivity. The overall pressure during the deposition was approximately 2.0 torr and the overall carrier gas used was purified $N_2$.

The selectivity was retained for at least 50 nm of tungsten and no film was deposited on two variants of low-K ($SiO_2$): Low-K 3.0 and Low-K 2.3.

Figure 4A:
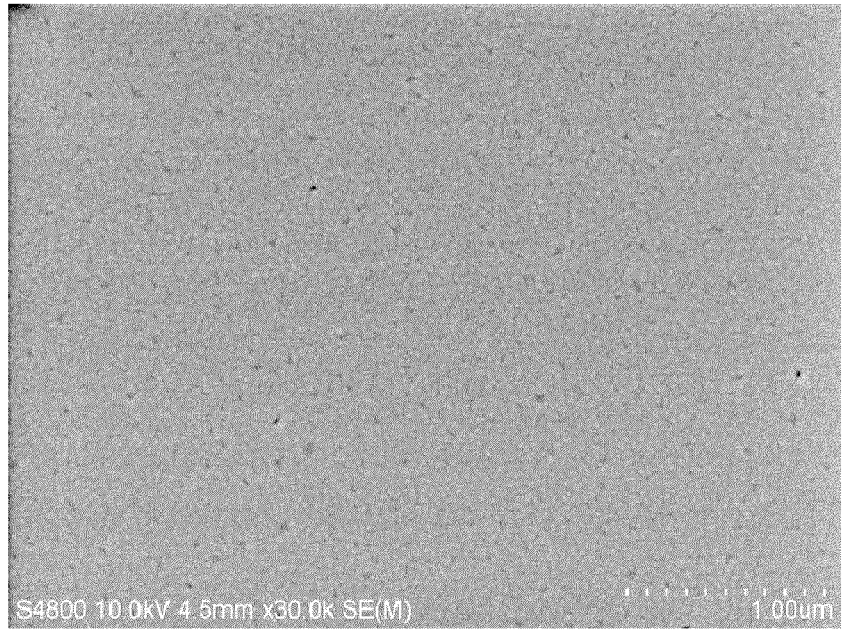
FIGS. 4a and 4b show scanning electron microscope (SEM) images of a copper surface and a low-k surface, respectively, treated in accordance with embodiments of the methods disclosed herein.
Figure 4B:
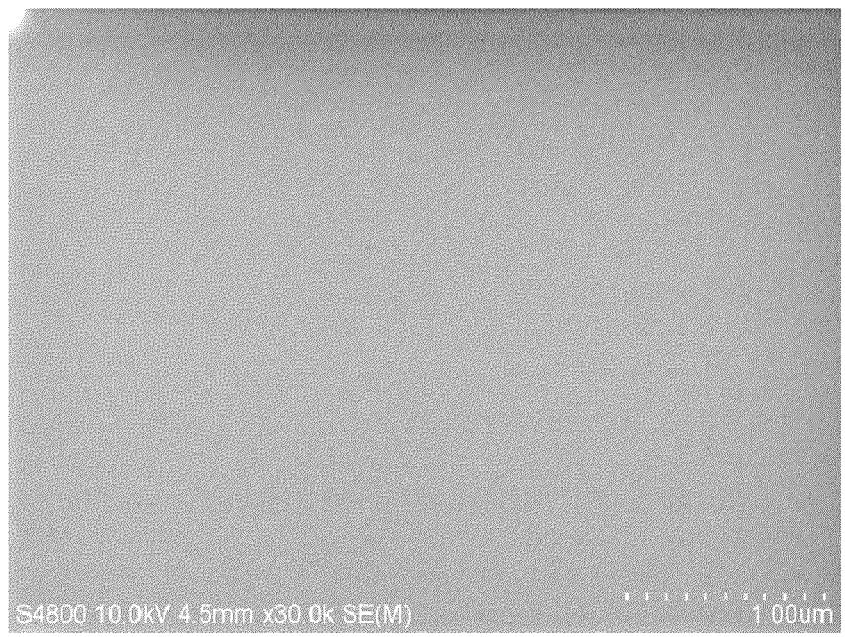

FIG. 4a shows a SEM image of 100 cycles of providing disilane and $WF_6$ to a Cu surface. FIG. 4b shows a SEM image of 100 cycles of providing disilane and $WF_6$ to a Low-K 2.3 surface, which was in the same reactor during the deposition as the sample analyzed in FIG. 4a.

Figure 5:
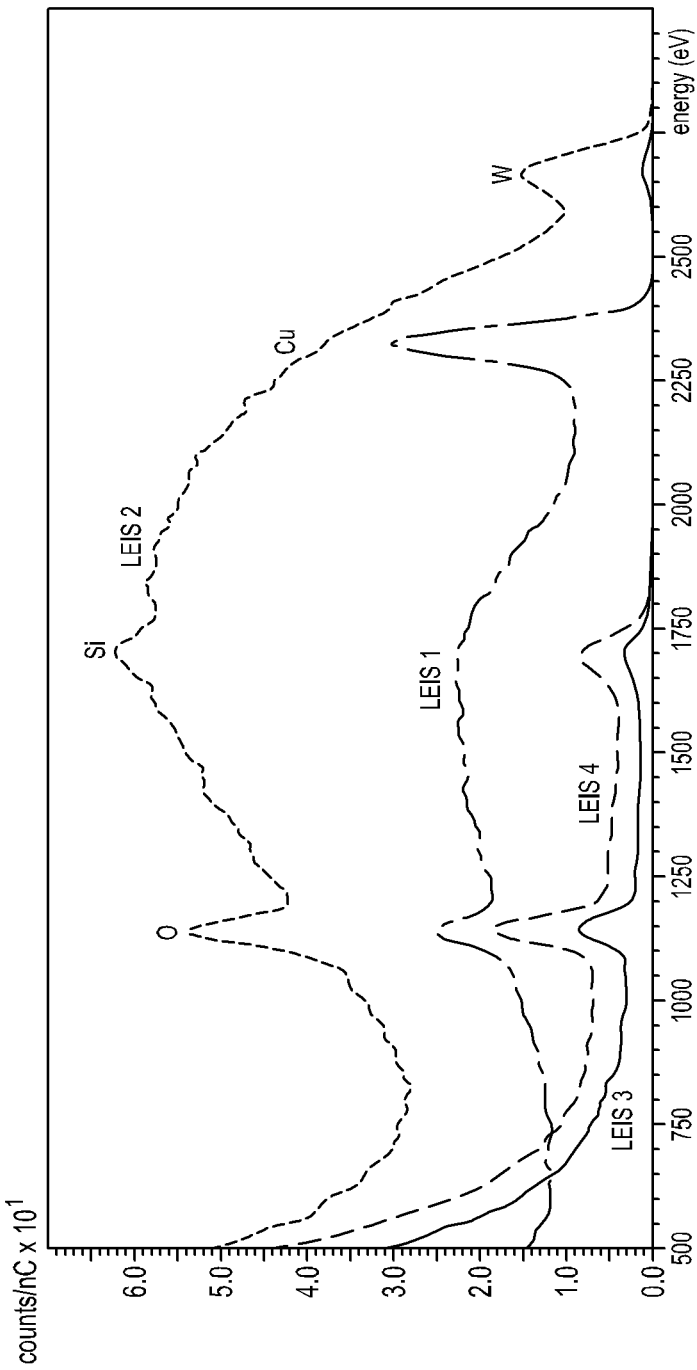
FIG. 5 shows low-energy ion scattering spectrums of four samples.

FIG. 5 shows a low-energy ion scattering (LEIS) spectrum of the varies copper and dielectric samples. Disilane and $WF_6$ were provided in each cycle. A curve marked with LEIS1 represents 2 cycles on a Cu surface. A curve marked with LEIS2 represents 100 cycles on a Cu surface. It can be seen from the LEIS2 spectrum that the Cu surface is fully covered by W as indicated by the peak at about 2675 eV. A curve marked with LEIS3 represents 100 cycles on a low-K 2.3 surface. A curve marked with LEIS4 represents 100 cycles on a low-K 3.0 surface. The peaks at energy values of about 2675 eV represent the W peak and the peak total area corresponds to the amount of W in the surface of the sample. With the scale of FIG. 5, the curves for LEIS1, LEIS3, and LEIS4 do not show significant peaks for W. It can be calculated from the peak areas in the spectrums that the selectivity of the W process applied to Cu vs. low-K 2.3 is at least about 98% and at least about 92% in the case of Cu vs. low-K 3.0.

EXAMPLE 3

Figure 6A:
FIG. 6A shows an image of tungsten selectively deposited on a copper surface relative to a low-k surface (Cu lines embedded in low-k (ELK)) in accordance with embodiments of the methods disclosed herein.
Figure 6B:
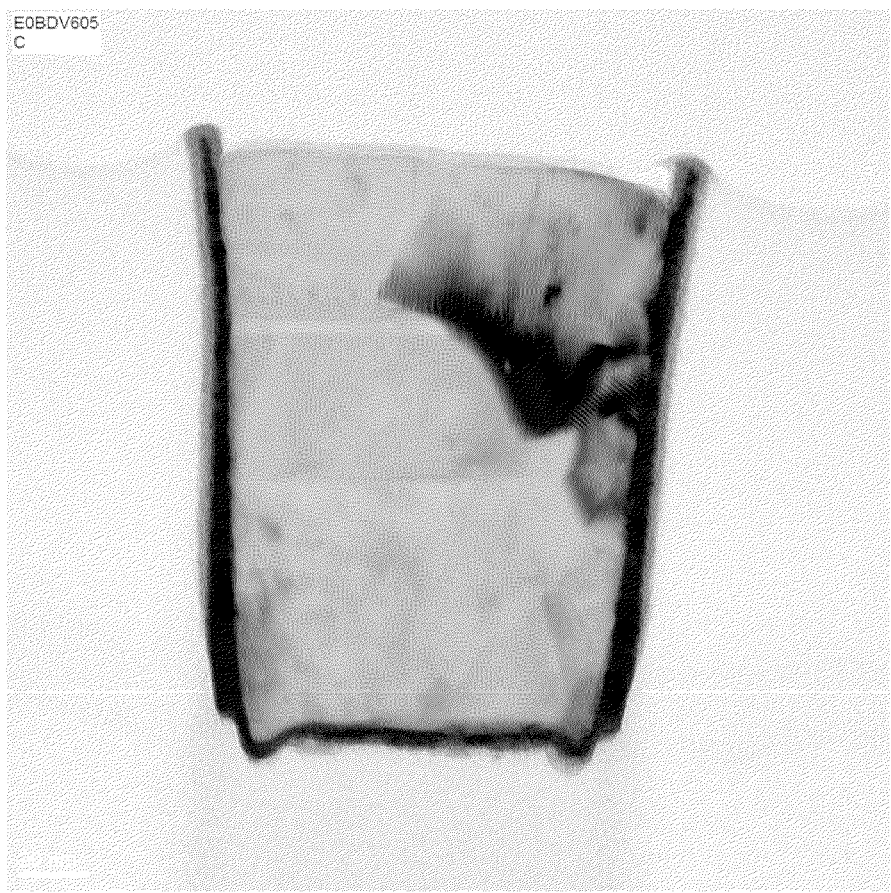
FIG. 6B shows an image of a copper line embedded in a low-k material.
Figure 7:
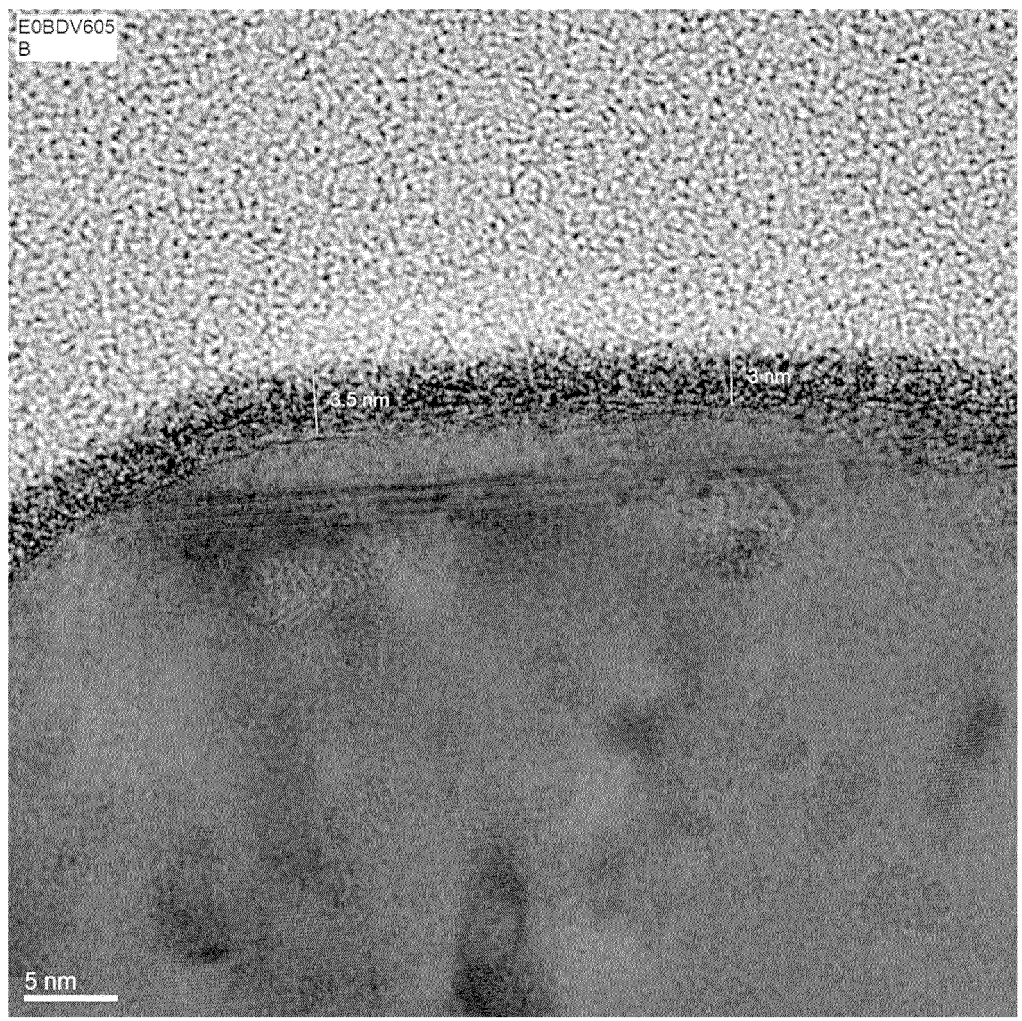
FIG. 7 shows an image detailing the thickness of a tungsten layer selectively deposited on a copper surface (Cu line) in accordance with embodiments of the methods disclosed herein.

A sample comprising copper lines embedded in a low-k material (ELK 2.3) was provided. Tungsten was selectively deposited on the copper, as shown in the TEM in FIG. 6A. In contrast, the control (FIG. 6B) shows no tungsten deposited over the copper. A magnification of the image of FIG. 6A is provided in FIG. 7, showing the thickness of the W selectively deposited on the top of the Cu line.

It will be appreciated by those skilled in the art that various modifications and changes can be made without departing from the scope of the invention. Similar other modifications and changes are intended to fall within the scope of the invention, as defined by the appended claims.

EXAMPLE 4

Tungsten was selectively deposited on a substrate comprising copper lines in a low-k material. A passivation removal step was carried out in which the substrate was treated consecutively with Ar plasma, Ar+$H_2$ plasma and with Ar+$H_2$+$N_2$ plasma for a total of 30 seconds without interruption. Plasma was generated at 100 W power at 100° C. Ar was flowed at 1200 sccm, $H_2$ at 50 sccm and $N_2$ at 18 sccm.

Following the passivation removal step, a dielectric surface restoration step was carried out. The substrate was treated with $Si_2H_6$ for 5 seconds, which is believed, without being bound to any theory, to prevent the oxidation of the of the surfaces of the copper line and not necessarily to restore the surfaces. The flow rate of the $Si_2H_6$ was 42 sccm.

After cooldown for 6 minutes at 600 torr in a $N_2$ atmosphere, the substrate was transported to a different module under nitrogen with some $O_2$ at 760 torr.

Figure 8:
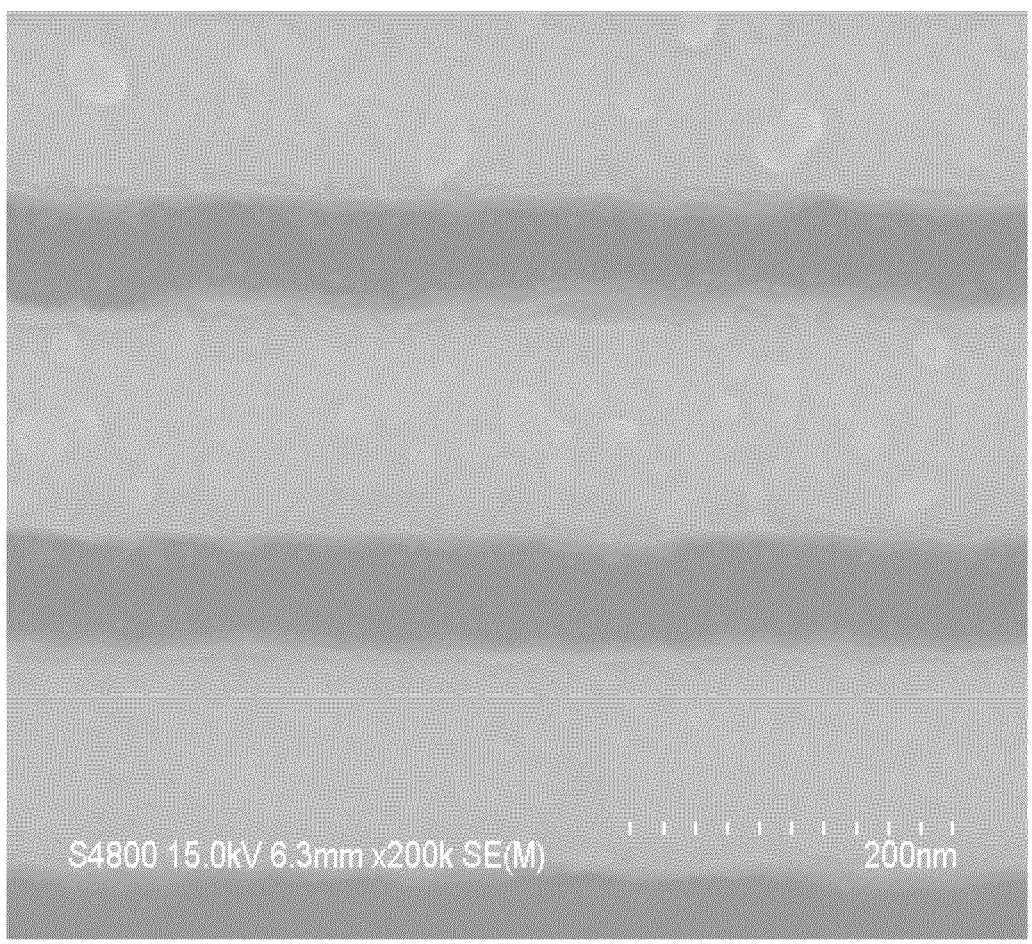
FIG. 8 shows an SEM image of tungsten selectively deposited on copper lines using the conditions described in Example 4.

Tungsten was then selectively deposited on the copper lines relative to the low-k material using alternating and sequential pulses of $WF_6$ and disilane, generally as described above. Deposition continued for 30 cycles at a temperature of about 130° C. A selectivity of greater than 95% was observed given a W thickness of less than 10 nm (about 8 nm nominal thickness). An SEM image of the selectively grown W on Cu is shown in FIG. 8.

What is claimed is:

1. A method for selectively depositing a film on a substrate comprising a first metal surface and a second dielectric surface, the method comprising:
   cleaning the substrate;
   after cleaning carrying out one or more deposition cycles, each cycle comprising:
      contacting the substrate with a first precursor comprising silicon or boron to selectively form a layer of first material comprising Si or B on the first metal surface relative to the second dielectric surface; and
      converting the first material on the first metal surface to a second metallic material by exposing the first material to a second precursor comprising metal,
   wherein the selectivity for deposition on the first metal surface relative to the second dielectric surface is greater than about 50%.

2. The method of claim 1, wherein cleaning comprises removing a passivation layer from the first metal surface.

3. The method of claim 1, wherein the first metal surface comprises copper.

4. The method of claim 1, wherein the second metallic material comprises a metal nitride.

5. The method of claim 1, wherein the second metallic material comprises a transition metal.

6. The method of claim 5, wherein the second metallic material comprises tungsten.

7. The method of claim 1, wherein cleaning comprises exposing the substrate to a plasma.

8. The method of claim 7, wherein the plasma comprises one or more of H, N and Ar.

9. The method of claim 1, wherein the second metallic material comprises a metal silicide.

10. The method of claim 1, additionally comprising annealing the substrate after cleaning and prior to carrying out the one or more deposition cycles.

11. The method of claim 1, wherein the second dielectric surface comprises a low k material with a dielectric value of less than about 4.0.

12. The method of claim 1, wherein the second precursor comprises $WF_6$.

13. The method of claim 1, wherein the method has a selectivity for depositing material on the first metal surface relative to the second dielectric surface of above about 90%.

14. The method of claim 1, further comprising repeating the contacting and converting steps two or more times.

15. The method of claim 1, wherein the second metallic material has a thickness less than about 10 nm.

16. The method of claim 1, wherein the second metallic material has a thickness of less than about 3 nm.

17. The method of claim 1, wherein a temperature of the substrate during the one or more deposition cycles is less than about 150° C.

18. A method for selectively depositing a film on a first copper surface of a substrate relative to a second dielectric surface of the substrate, the method comprising:
   contacting the substrate with a plasma; and
   after contacting the substrate with the plasma, conducting one or more deposition cycles, each deposition cycle comprising:
      contacting the substrate with a first precursor comprising silicon or boron; and
      contacting the substrate with a second precursor comprising a metal fluoride;
   wherein a temperature of the substrate during the one or more deposition cycles is selected such that a film forms on the first copper surface with a selectivity of greater than about 90% relative to the second dielectric surface.

19. The method of claim 18, wherein the substrate is an integrated circuit workpiece comprising copper lines with a width of less than about 1 micrometer.

20. The method of claim 18, additionally comprising a dielectric surface restoration step after contacting the substrate with the plasma and prior to the one or more deposition cycles, wherein the dielectric surface restoration step comprises contacting the substrate with $Si_2H_6$ or trimethylchlorosilane.

21. The method of claim 18, wherein the substrate is contacted with plasma in a first reaction chamber and the deposition cycles are carried out in a second, different deposition chamber.

22. A method for selectively depositing a film on a first metal surface of a substrate relative to a second dielectric surface, the method comprising:
- cleaning the substrate surface with plasma comprising noble gas to remove a passivation layer from the first metal surface;
- after cleaning, selectively depositing a film on the first metal surface relative to the second dielectric surface,
- wherein the selectivity for deposition on the first metal surface relative to the second dielectric surface is greater than about 50% and wherein the second dielectric surface has not been treated to block deposition prior to selectively depositing the film.

23. The method of claim 22, wherein the second dielectric surface does not comprise a blocking or passivation layer when depositing the film.

24. The method of claim 22, wherein the gas used in the plasma process comprises only Ar and no other elements.

25. The method of claim 22, wherein selectively depositing a film comprises carrying out one or more sequential deposition cycles, each cycle comprising alternately contacting the substrate with a first reactant and a second reactant.

26. The method of claim 22, wherein the first reactant comprises silicon or boron and the second reactant comprises a metal.

27. The method of claim 22, additionally comprising a surface restoration step after the cleaning step and before the deposition step, wherein the surface restoration step comprises contacting the second dielectric surface with one or more silanes.

28. The method of claim 22, wherein the selectivity is greater than about 90%.

29. The method of claim 22, additionally comprising annealing the substrate at about 150° C. to about 400° C. after cleaning and prior to depositing the film.

30. The method of claim 29, wherein the film is a metallic film.

* * * * *